United States Patent [19]

Kukutsu et al.

[11] Patent Number: 5,940,783
[45] Date of Patent: Aug. 17, 1999

[54] MICROPROCESSOR AND METHOD OF TESTING THE SAME

[75] Inventors: Atsushi Kukutsu; Kozo Nuriya; Takao Ohkawara, all of Osaka; Junji Soga, Kyoto; Tadashi Yoshino, Osaka, all of Japan

[73] Assignee: Matsushita Electric Industrial Co., Ltd., Osaka, Japan

[21] Appl. No.: 08/986,136

[22] Filed: Dec. 5, 1997

[30]     Foreign Application Priority Data

Dec. 10, 1996  [JP]  Japan .................................. 8-329579

[51] Int. Cl.⁶ .................................................. G05B 19/00
[52] U.S. Cl. ........................ 702/120; 371/22.5; 371/22.6; 395/183.06; 395/183.12
[58] Field of Search ........................ 702/120; 371/22.36, 371/22.5, 22.31, 22.6; 395/183.06, 183.12

[56]               References Cited

U.S. PATENT DOCUMENTS 4,975,641  12/1990  Tanaka et al. .......................... 371/22.5
5,101,498   3/1992  Ehlig et al. ........................ 395/183.06
5,557,558   9/1996  Daito ....................................... 702/120
5,657,330   8/1997  Matsumoto ............................. 371/22.5
5,742,617   4/1998  Warren .................................. 371/22.31

FOREIGN PATENT DOCUMENTS 6174796   6/1994   Japan .

*Primary Examiner*—John Barlow
*Assistant Examiner*—Hien Vo
*Attorney, Agent, or Firm*—Stevens, Davis, Miller & Mosher, L.L.P.

[57]                ABSTRACT

A microprocessor includes an assign function for assigning ports to a mode identifying unit, test signal input unit, and test result signal output unit, a test implement function for sending test results to the test result signal output unit according to the test data signals input from the test signal input unit, and an activation control function for activating the test implement function upon identifying a test mode by the status of the mode identifying unit. When a test mode signal from test equipment is received at the test mode identifying unit assigned to one port of the microprocessor, the test signal input unit and the test result signal output unit are assigned to other ports of the microprocessor, and when the test data signals from the test equipment are received at the test data signal input unit, test result signals according the test data signals are output from the test result signal output unit.

15 Claims, 5 Drawing Sheets

1:MICROPROCESSOR
100:STORAGE MEANS OF MICROPROCESSOR 1

1: MICROPROCESSOR
100: STORAGE MEANS OF MICROPROCESSOR 1

MICROPROCESSOR AND METHOD OF TESTING THE SAME

BACKGROUND OF THE INVENTION (a) Field of the Invention

The present invention relates to a microprocessor and a method of testing the same.

(b) Description of the Related Art

The need for interconnect testing at the printed circuit board and system levels is an issue of very high priority in industry. With increasing integration of integrated circuit devices (hereinafter abbreviated ICs) and higher packing density of printed circuit boards in recent years, the usefulness of currently practiced circuit test methods using test probes (bed of nails) on the board level has been diminished significantly.

Furthermore, ICs have been increasing in functional capabilities, and development of test programs for such ICs has been becoming extremely difficult and virtually impossible even in an environment where test probes could be used. Among other difficulties, test programs for microprocessors have not been easy to develop because their control circuitry is very complex.

A prior art microprocessor test method using test probes will be described with reference to FIG. 5.

FIG. 5 is a diagram showing the microprocessor test method according to the prior art. In FIG. 5, reference numeral 71 is a microprocessor, 72 and 73 are input pins on the microprocessor, 74 and 75 are output pins on the microprocessor, and 76, 77, 78, and 79 are bidirectional pins on the microprocessor. Further, reference numeral 80 is a printed circuit board, 81 and 82 are test probes used to apply signals to the input pins on the microprocessor, 83 and 84 are test probes used to observe signals at the output pins on the microprocessor, and 85, 86, 87, and 88 are test probes used to apply signals to or observe output signals at the bidirectional pins on the microprocessor. These test probes are used to send signals from test equipment (not shown) to the device under test or to send signals from the device under test to the test equipment. For simplicity of explanation, devices on the printed circuit board 80, other than the microprocessor, and wiring interconnects not relevant to the explanation are omitted.

The prior art test method necessitates the development of a test program such that every signal pin is driven to a high voltage (hereinafter designated "1") and to a low voltage (hereinafter designated "0") at least once, and every input signal causes a change in the output without exception, to enable the detection of faulty soldering. In FIG. 5, when the bidirectional pins 76, 77, 78, and 79 are in input mode, the output pins 74 and 75 must be caused to change to "1" and to "0" at least once for input signals with which the input pins 72 and 73 and the bidirectional pins 76, 77, 78, and 79 each change to "1" and to "0" at least once. Conversely, when the bidirectional pins 76, 77, 78, and 79 are in output mode, the output pins 74 and 75 and the bidirectional pins 76, 77, 78, and 79 must be caused to change to "1" and to "0" at least once for input signals with which the input pins 72 and 73 each change to "1" and to "0" at least once. Testing cannot be done on portions where these requirements are not satisfied. For example, for an input pin that takes the state "1" when in an open state (internally pulled state), an open pin fault cannot be detected on that pin with a test program in which the pin only takes the state "1". Under such circumstances, to develop a test program for a conventional 16-bit microprocessor, for example, it takes a full-time test program developer half a month to one month, which is not practical in view of a usual product development schedule.

Against this backdrop, the IEEE adopted boundary-scan technology as a standard in 1990 (IEEE Std1149.1-1990). The intent of boundary scan is to realize easy and complete testing of digital devices on a circuit board by embedding test circuitry into integrated circuit devices. With boundary scan, testing is done by transferring test data between test circuits via wiring interconnects, which offers the advantage of significant savings in the number of test probes. Further, since boundary scan is a standard defining test circuitry, test programs can be automatically generated by software independently of the size and functions of integrated circuit devices themselves. This enables test programs to be developed in a short time. In fact, boundary scan compatible microprocessors are already on the market. The 32-bit microprocessor 80486 family of Intel and the 32-bit microprocessor 68040 of Motorola are examples.

However, in today's electronic appliances, not all digital devices are boundary scan compatible. Boundary scan works most effectively when there are a plurality of boundary scan ICs mounted on a circuit board and when these ICs are interconnected on the board, but in reality its effectiveness is often not fully utilized because of a limited number of boundary scan devices mounted on a circuit board. One reason is that many general-purpose ICs today are still not boundary scan compatible. Also, there are not many general-purpose microprocessors that are boundary scan compatible. For example, if integrated circuit devices peripheral to a microprocessor are ones newly developed to be compatible with boundary scan, the usual boundary scan interconnect testing cannot be conducted on the interconnects between the boundary scan devices and the microprocessor if the microprocessor is a general-purpose microprocessor not compatible with boundary scan.

In consumer electronic appliances, boundary scan non-compatible general-purpose microprocessors are still widely used for reasons of cost, because newly developing a boundary scan compatible microprocessor often does not justify the cost. In the case of signal processing ICs, for example, since the development of this type of IC is indispensable for a certain type of product, newly developing boundary scan compatible devices does not involve a large cost demerit, or rather, the demerit is small. In the case of microprocessors, on the other hand, many practical applications can use general-purpose microprocessors; therefore, newly developing a boundary scan compatible microprocessor may not do any good but for test purposes.

One possible test method to address this problem would be to operate the microprocessor by using the boundary scan registers of the boundary scan peripheral devices connected to the microprocessor, and to latch the results back into the boundary scan registers of the peripheral devices to check the results. This, however, would need a test program for operating the microprocessor, and since it takes a considerable development time, as earlier stated, this method is not practical.

For these reasons, it has been extremely difficult to test wiring interconnects on boundary scan noncompatible microprocessors mounted on printed circuit boards.

SUMMARY OF THE INVENTION

It is an object of the present invention to provide a microprocessor that is not boundary scan compatible and that permits easy and complete interconnect testing on user configurable ports, and a method of testing such a microprocessor. Here, user configurable ports refer to the ports that can be freely configured using software by the user. Microprocessor pins whose uses are defined by hardware are not included in such ports.

The microprocessor of the present invention includes: an assign function for assigning ports to mode identifying means for identifying a test mode, test signal input means for inputting test data signals, and test signal output means for outputting test result signals; a test implement function for sending test results to the test signal output means according to the test data signals input from the test signal input means; and an activation control function for activating the test implement function upon identifying the test mode by the status of the mode identifying means.

The microprocessor test method of the present invention is characterized in that: mode identifying means for identifying a test mode is assigned to one port of a microprocessor; when a test mode signal from test equipment is received at the mode identifying means, test signal input means for inputting test data signals and test signal output means for outputting test result signals are assigned to other ports of the microprocessor; and when the test data signals from the test equipment are received at the test signal input means, the test result signals according to the test data signals are output from the test signal output means.

According to the present invention, it becomes possible to perform interconnect testing easily and completely on user configurable ports of microprocessors, which has been extremely difficult in the prior art. Furthermore, since fault locations can be identified, repair efficiency improves and repair costs can be reduced. Also, the fact that microprocessors can be tested easily contributes to shortening the development time of test programs and reducing time-to-market.

Moreover, since there is no need to design boundary scan test circuitry into microprocessors, silicon resources for integrated circuits can be saved.

When the microprocessor of the present invention is combined with boundary scan compatible devices, the number of probes for testing the microprocessor can be reduced; this offers a great advantage in testing high packing density printed circuit boards. Since the number of test probes can be minimized, the test tool cost can be reduced, and the same test tool can also be used for the testing of different devices. Furthermore, remote test diagnosis and product self-diagnostic functions can be easily realized using boundary scan technology.

DETAILED DESCRIPTION

An embodiment of the present invention will be described below with reference to drawings.

Figure 1:
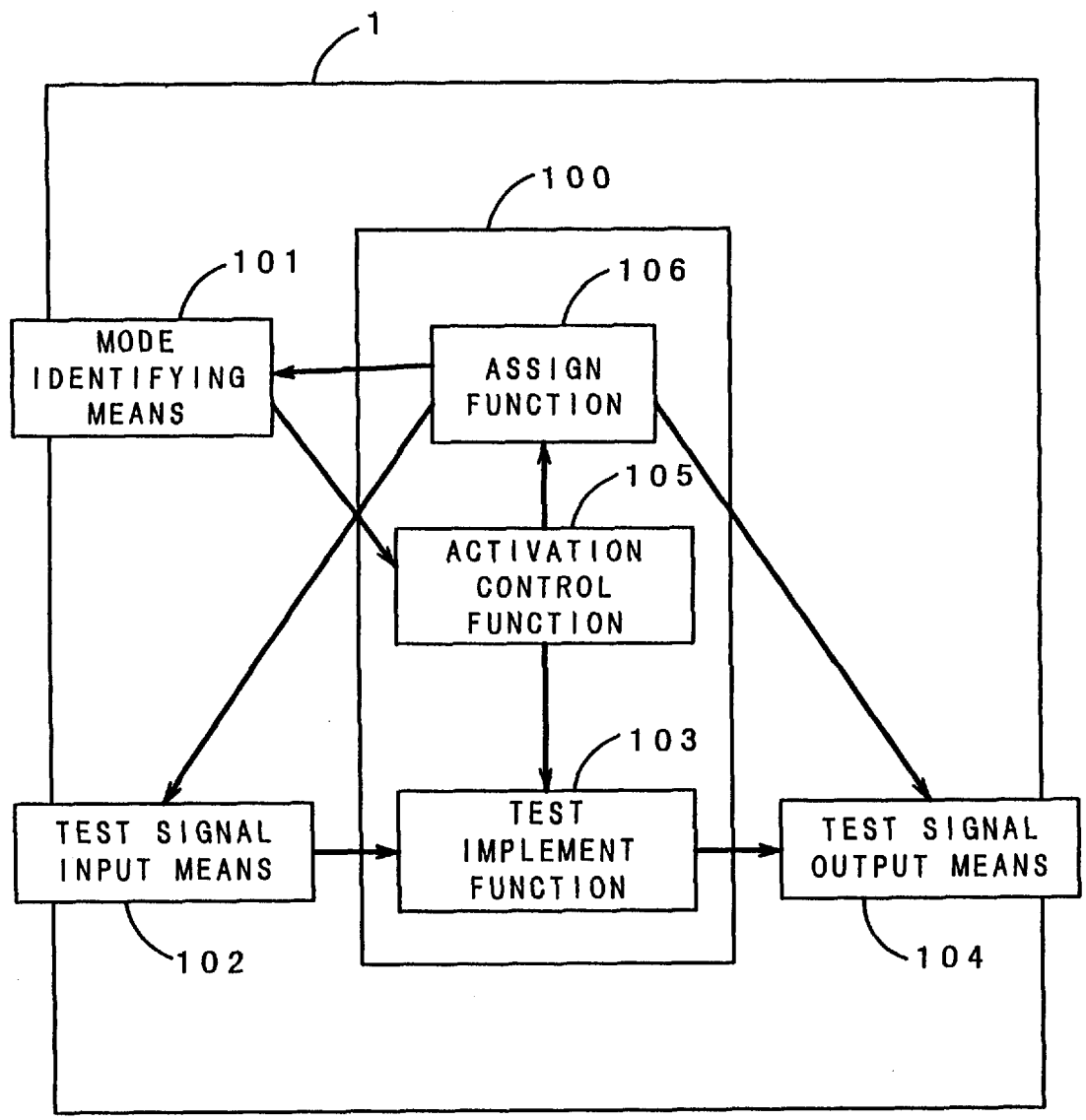
FIG. 1 is a block diagram showing the configuration of a microprocessor according to an embodiment of the present invention.

FIG. 1 is a block diagram showing the configuration of a microprocessor according to the embodiment of the present invention. In FIG. 1, reference numeral 1 designates the microprocessor of the present invention. Reference numeral 101 is a mode identifying means, 102 is a test signal input means, and 104 is a test signal output means. These are assigned to ports of the microprocessor 1 by an assign function 106. Reference numeral 103 is a test implement function, and 105 is an activation control function. The assign function 106, the test implement function 103, and the activation control function 105 are incorporated in a storage means 100 of the microprocessor 1.

After power on, the microprocessor 1 activates a function for normal operation. Usually, prior to the activation of this normal operation function, hardware and software initialization of ports, etc. is performed. In the present embodiment, during the initialization, or before or after the initialization, the assign function 106 is executed to assign a port to the mode identifying means 101. This can be followed by one or the other of the following two processes.

(1) The normal operation function is activated, and the activation control function 105 included in the normal operation function monitors the status of the mode identifying means 101, and activates the test implement function 103 as necessary.

(2) Prior to the activation of the normal operation function, the activation control function 105 is activated, which then determines, based on the status of the mode identifying means, whether to activate the test implement function 103 or the normal operation function.

In the case of process (1), the test implement function 103 can be activated to carry out a test at any time even when the microprocessor is in the process of executing the normal operation function, but this will run the risk of incurring malfunctioning when noise or the like is introduced in the mode identifying means 101. In the case of process (2), on the other hand, the test implement function 103 can be activated only at the time power is turned on to the microprocessor 1, but there is no concern of malfunctioning by unintentional activation of the test implement function 103 during normal operation. Which of the two processes, (1) or (2), is to be implemented should be determined from a broad standpoint by considering the product in which the microprocessor 1 is used and the test system employed, but it can be said that process (2) is the safer and is not so disadvantageous for testing.

In accordance with process (1) or (2), the test signal input means 102 and the test signal output means 104 are assigned by the assign function 106 to ports of the microprocessor 1, and the test implement function 103 is activated. The assignment of ports to the test signal input means 102 and test signal output means 104 by the assign function 106 may be performed before or after the activation of the test implement function 103.

Figure 2:
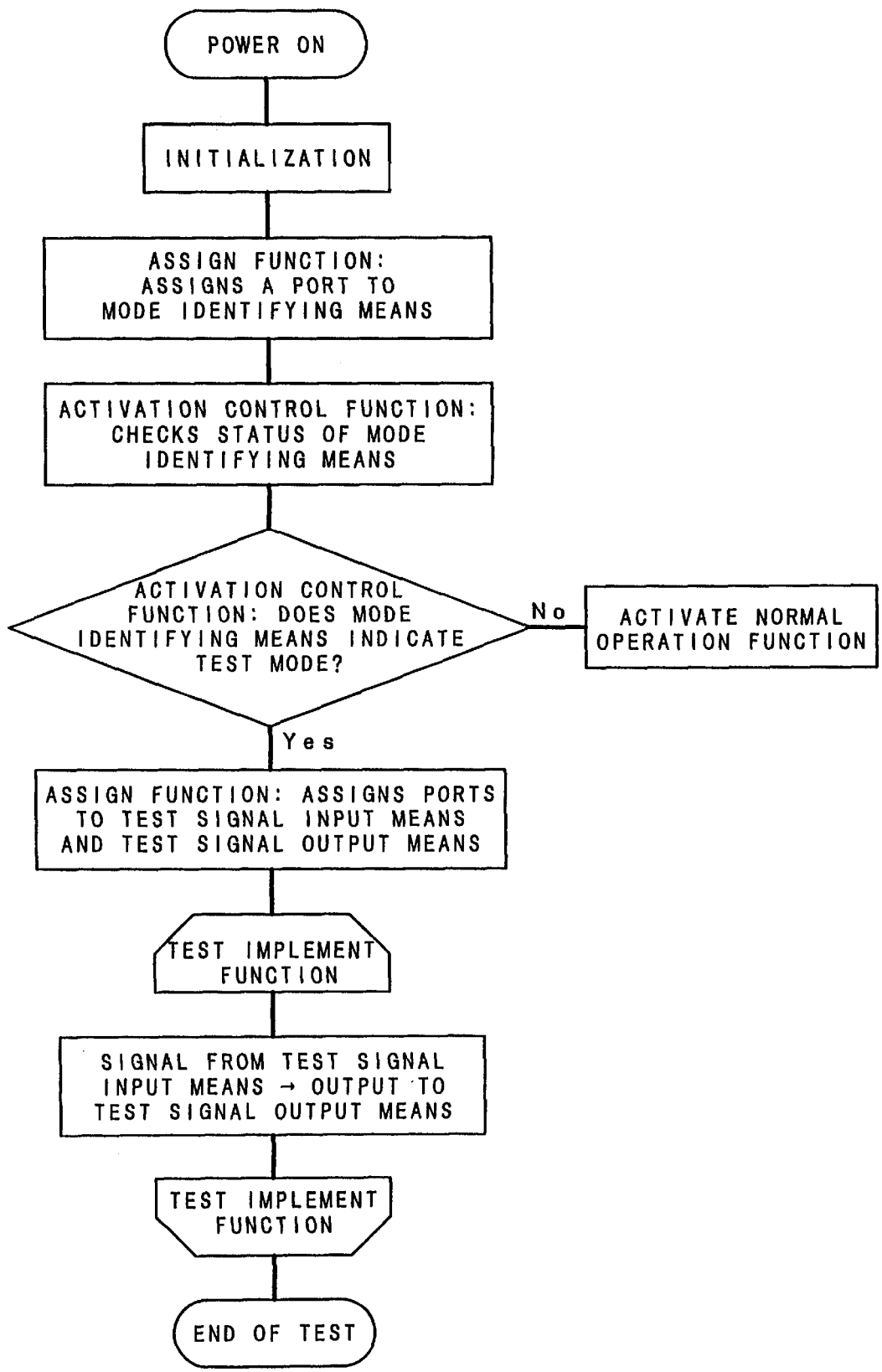
FIG. 2 is a flowchart showing one example of processing in the microprocessor according to the embodiment of the present invention.

The test implement function 103 implements a test by receiving test data signals from the test signal input means 102 and by outputting test result signals via the test signal output means 104. FIG. 2 shows a flowchart illustrating the operation of the respective functions and the processing flow from the moment when power is turned on to the microprocessor 1 until the test implement function 103 implements the test, for example, when the test implement function 103 is called in accordance with process (2).

A first example of the test method for the microprocessor 1 shown in FIG. 1 will be described below with reference to FIG. 3.

Figure 3:
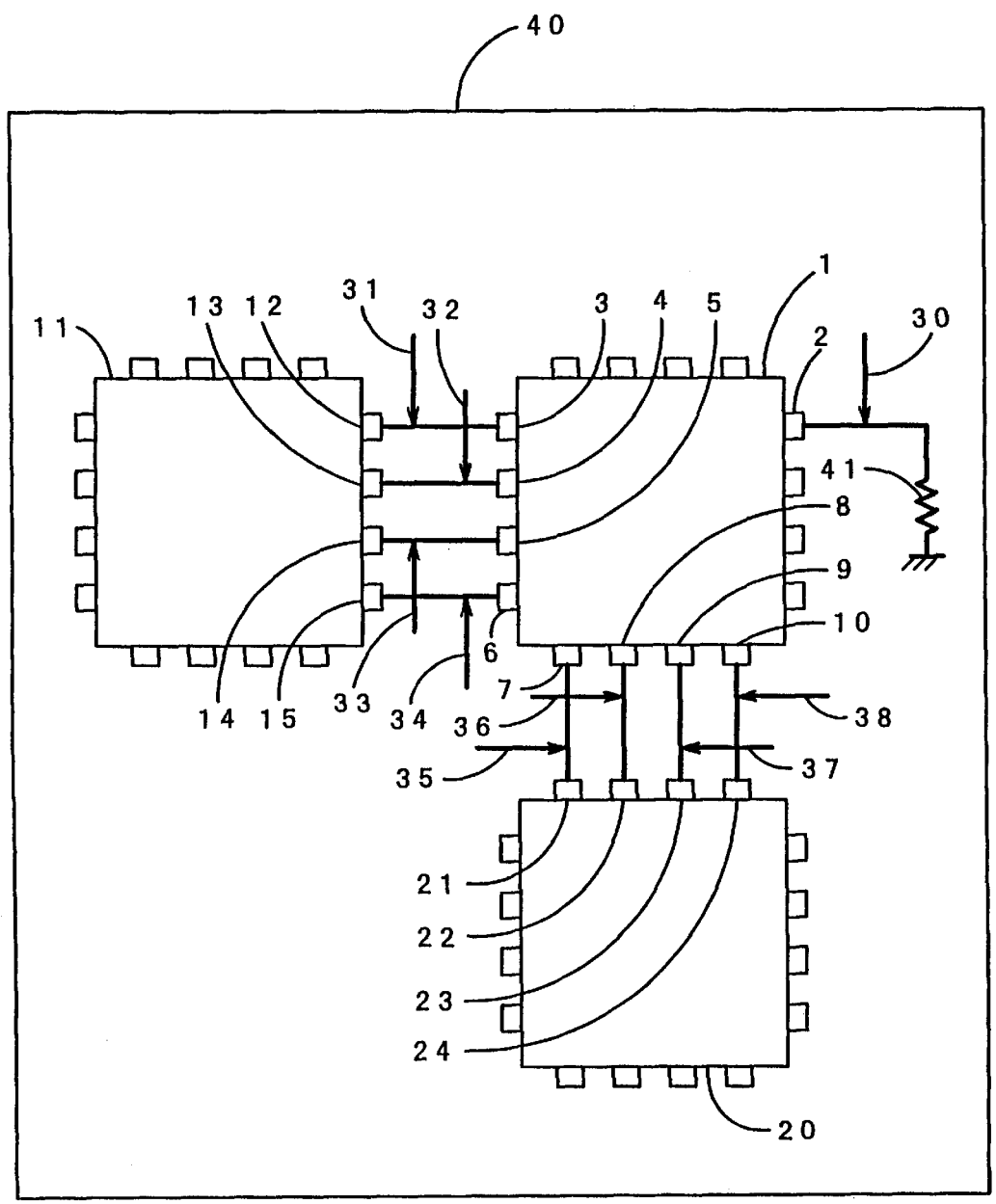
FIG. 3 is a diagram showing a first example of a microprocessor test method according to the embodiment of the present invention.

In FIG. 3, reference numeral 1 is the same microprocessor as that shown in FIG. 1, and 2 to 10 are ports of the microprocessor 1. The port 2 is grounded via a resistor 41, and is assigned to the mode identifying means 101 by the assign function shown in FIG. 1. The ports 3, 4, 5, and 6 are assigned to the test signal input means 102 by the assign function 106 shown in FIG. 1 when performing a test. The ports 7, 8, 9, and 10 are assigned to the test signal output means 104 by the assign function 106 shown in FIG. 1 when performing a test.

Reference numeral 11 is an IC, and 12, 13, 14, and 15 are pins of the IC 11, which are respectively connected to the ports 3, 4, 5, and 6 of the microprocessor 1.

Reference numeral 20 is an IC, and 21, 22, 23, and 24 are pins of the IC 20, which are respectively connected to the ports 7, 8, 9, and 10 of the microprocessor 1.

Reference numerals 30, 31, 32, 33, 34, 35, 36, 37, and 38 are test probes. The test probe 30 is attached to the circuit board in physically and electrically contacting fashion to communicate signals between the port 2 and test equipment (not shown). The test probes 31, 32, 33, and 34 and the test probes 35, 36, 37, and 38 are attached to the circuit board in the same fashion to communicate signals with the ports 3, 4, 5, and 6 and the ports 7, 8, 9, and 10, respectively.

Reference numeral 40 is the printed circuit board. In FIG. 3, for simplicity of explanation, devices on the printed circuit board 40, other than the microprocessor 1 and the ICs 11 and 20, and wiring interconnects not relevant to the explanation are omitted.

When testing wiring interconnects on the microprocessor 1, the test equipment (not shown) sends a signal to the port 2 via the test probe 30 to put the microprocessor 1 into test mode. The illustrated example assumes the case where the low voltage state of the port 2 is the normal operating state of the microprocessor 1, since the port 2 is normally grounded via the resistor 41. Accordingly, when a high voltage signal is applied from the test equipment to the port 2 via the test probe 30, the microprocessor 1 receives the test mode signal from the port 2 that is assigned to the mode identifying means by the assign function, as a result of which the test implement function is activated by the activation control function, and the ports 3, 4, 5, and 6 are assigned to the test signal input means and the ports 7, 8, 9, and 10 to the test signal output means by the assign function.

The test implement function performs uniquely defined operations by the test data signals applied via the test probes 31, 32, 33, and 34 to the ports 3, 4, 5, and 6 of the test signal input means, and outputs the results at the ports 7, 8, 9, and 10 of the test signal output means. The test result signals output at the ports 7, 8, 9, and 10 of the test signal output means are sent via the test probes 35, 36, 37, and 38 to the test equipment, which compares them with the input signals to check whether the results match the operations expected of the test implement function, and thereby verifies whether the test has been implemented correctly.

The test implement function will be described in further detail by way of specific example. It is desirable that the test implement function be defined to perform an operation that is as simple as possible and that provides a unique output for an input signal. In this example, since the number of ports of the test signal input means is the same as that of the test signal output means, the test implement function is defined so that the signals input at the ports 3, 4, 5, and 6 are output unchanged at the ports 10, 9, 8, and 7, respectively. Testing is carried out on the microprocessor 1 equipped with this test implement function in accordance with the following procedure.

(1) The test equipment sends signals "1" (high voltage) to the port 3, "0" to the port 4, "1" to the port 5, and "0" (low voltage) to the port 6 of the test signal input means via the test probes 31, 32, 33, and 34.

(2) In response to the signals input to the test signal input means in step (1), the test implement function operates and outputs "0" to the port 7, "1" to the port 8, "0" to the port 9, and "1" to the port 10 of the test signal output means.

(3) The signals output from the ports 7, 8, 9, and 10 of the test signal output means are sent to the test equipment via the test probes 35, 36, 37, and 38. The test equipment compares the signals received from the test signal output means with prestored output expected values, and if they match, proceeds to the next step; if they do not match, it is determined that there is a wiring fault.

(4) Next, the test equipment sends signals "0" to the port 3, "1" to the port 4, "0" to the port 5, and "1" to the port 6 of the test signal input means via the test probes 31, 32, 33, and 34.

(5) In response to the signals input to the test signal input means in step (4), the test implement function operates and outputs "1" to the port 7, "0" to the port 8, "1" to the port 9, and "0" to the port 10 of the test signal output means.

(6) The signals output from the ports 7, 8, 9, and 10 of the test signal output means are sent to the test equipment via the test probes 35, 36, 37, and 38. The test equipment compares the signals received from the test signal output means with prestored output expected values, and if they match, it is determined that the test results are correct, and the test process is terminated; if they do not match, it is determined that there is a wiring fault.

As described, according to the above test method (first example), interconnect testing can be performed easily and completely on the user configurable ports of the microprocessor 1. Furthermore, since fault locations can be identified, repair efficiency improves and repair costs can be reduced. Also, the fact that the microprocessor 1 can be tested easily contributes to shortening the development time of the test program and reducing time-to-market.

Moreover, since there is no need to design boundary scan test circuitry into the microprocessor 1, silicon resources for integrated circuits can be saved.

Next, a second example of the test method for the microprocessor 1 shown in FIG. 1 will be described with reference to FIG. 4. In the second example, the test method will be described for the case when the microprocessor 1 is combined with boundary scan compatible devices.

Figure 4:
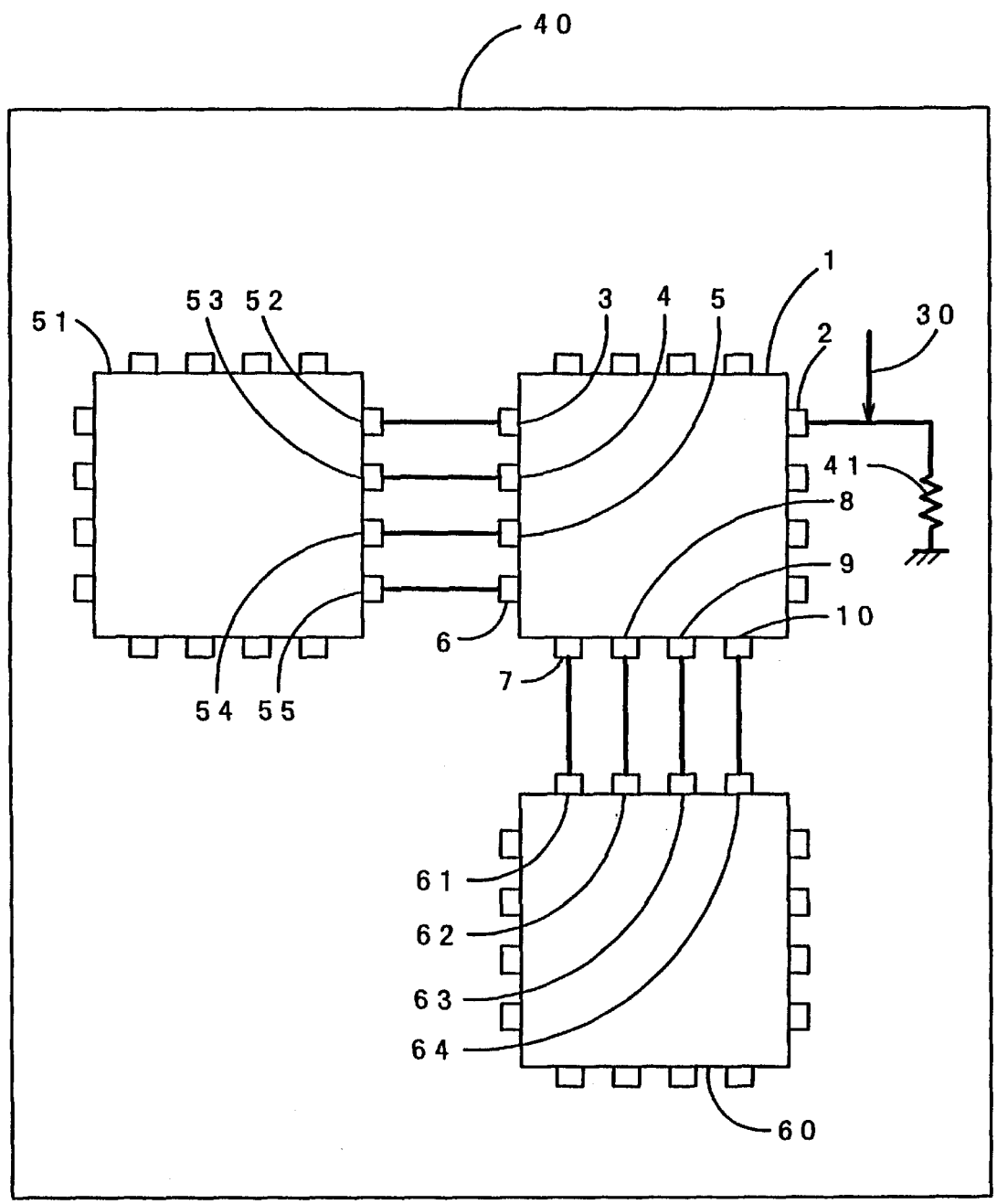
FIG. 4 is a diagram showing a second example of a microprocessor test method according to the embodiment of the present invention.
Figure 5:
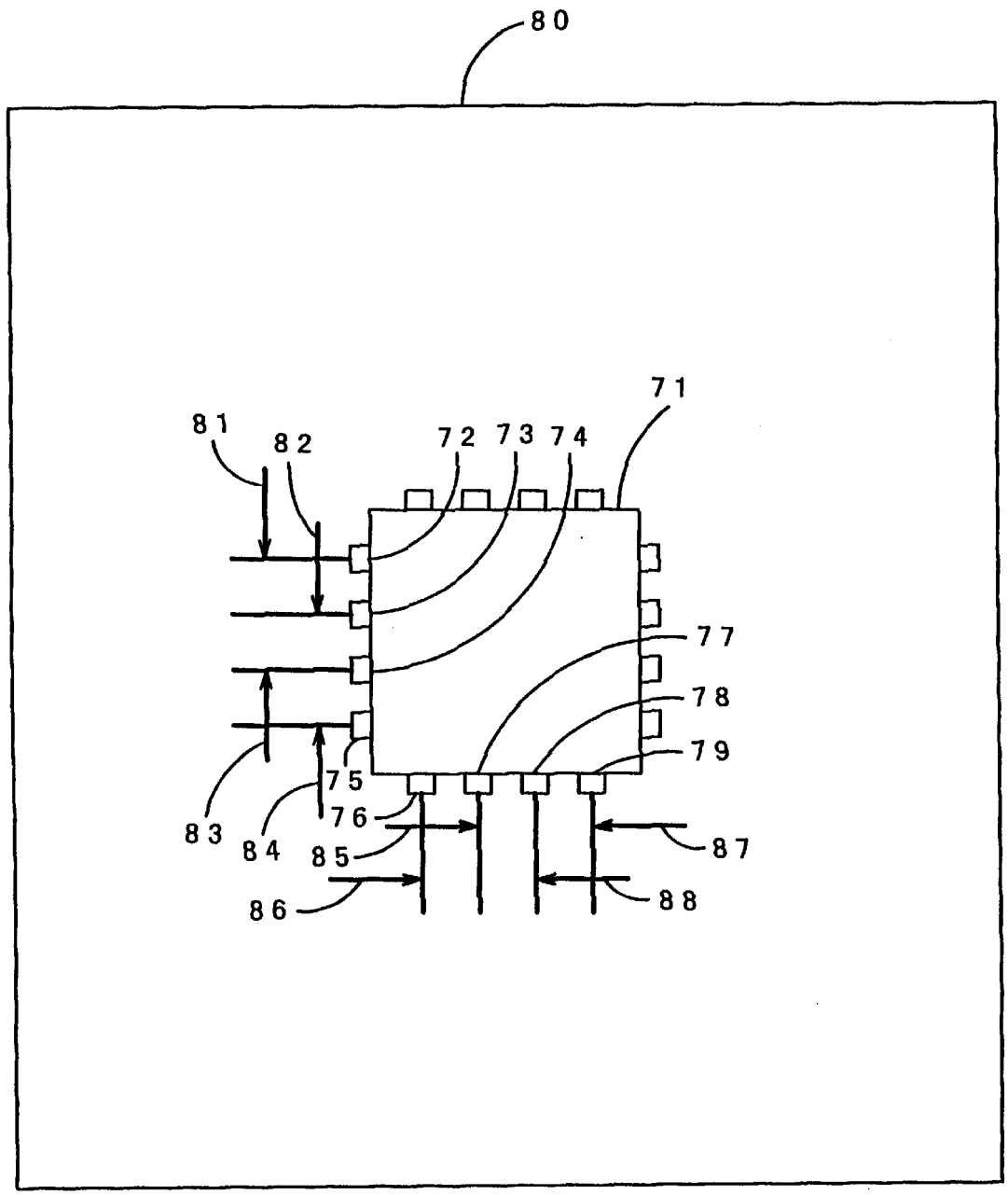
FIG. 5 is a diagram showing a microprocessor test method according to the prior art.

In FIG. 4, the microprocessor 1 and the resistor 41 are the same as those shown in FIG. 3; the port 2 of the microprocessor 1 is grounded via the resistor 41, and is assigned to the mode identifying means 101 by the assign function 106 shown in FIG. 1. The ports 3, 4, 5, and 6 are assigned to the test signal input means 102 by the assign function 106 shown in FIG. 1 when performing a test. The ports 7, 8, 9, and 10 are assigned to the test signal output means 104 by the assign function 106 shown in FIG. 1 when performing a test.

Reference numeral 51 is a boundary scan compatible IC, and 52, 53, 54, and 55 are output pins of the IC 51 with a boundary scan register, which are respectively connected to the ports 3, 4, 5, and 6 of the microprocessor 1.

Reference numeral 60 is a boundary scan compatible IC, and 61, 62, 63, and 64 are input pins of the IC 60 with a boundary scan register, which are respectively connected to the ports 7, 8, 9, and 10 of the microprocessor 1.

Reference numeral 30 is a test probe. The test probe 30 is attached to the circuit board in physically and electrically contacting fashion to communicate signals between the port 2 and test equipment (not shown).

Reference numeral 40 is the printed circuit board, similar to the one shown in FIG. 3; in this example also, for simplicity of explanation, devices on the printed circuit board 40, other than the microprocessor 1 and the ICs 51 and 60, and wiring interconnects not relevant to the explanation are omitted.

Though not shown in the figure, the ICs 51 and 60 form a boundary scan chain so that boundary scan testing can be conducted on the printed circuit board 40.

When testing wiring interconnects on the microprocessor 1, the test equipment sends a signal to the port 2 via the test probe 30 to put the microprocessor 1 into test mode. The illustrated example, as in the example of FIG. 3, assumes the case where the low voltage state of the port 2 is the normal operating state of the microprocessor 1, since the port 2 is normally grounded via the resistor 41. Accordingly, when a high voltage signal is applied from the test equipment to the port 2 via the test probe 30, the microprocessor 1 receives the test mode signal from the port 2 that is assigned to the mode identifying means by the assign function, as a result of which the test implement function is activated by the activation control function, and the ports 3, 4, 5, and 6 are assigned to the test signal input means and the ports 7, 8, 9, and 10 to the test signal output means by the assign function.

Using the boundary scan chain, test data signals are set and output at the output pins 52, 53, 54, and 55 of the IC 51. The test implement function performs uniquely defined operations by receiving the test data signals, output from the IC 51, at the ports 3, 4, 5, and 6 of the test signal input means, and outputs the results at the ports 7, 8, 9, and 10 of the test signal output means. The test result signals output from the ports 7, 8, 9, and 10 of the test signal output means are stored in the boundary scan registers placed at the input pins 61, 62, 63, and 64 of the IC 60, and are sent to the test equipment via the boundary scan chain. The test equipment verifies whether the test has been carried out correctly by comparing the received signals with the input signals and determining whether the results match the operations expected of the test implement function.

The test implement function will be described in further detail by way of specific example. For simplicity of explanation, the test implement function used here is the same as that shown in the first example. Testing is carried out on the microprocessor 1 equipped with this test implement function in accordance with the following procedure.

(1) From the test equipment, boundary scan EXTEXT instruction is loaded into the ICs 51 and 60 to put them into implement state.

(2) From the test equipment, the ICs 51 and 60 are set into Shift-DR state, and signals "1", "0", "1", and "0" are set at the respective output pins 52, 53, 54, and 55 of the IC 51 via the boundary scan chain.

(3) From the test equipment, the ICs 51 and 60 are set into Update-DR state, and the signals "1", "0", "1", and "0" set at the respective output pins 52, 53, 54, and 55 of the IC 51 are output to the ports 3, 4, 5, and 6 of the test signal input means.

(4) In response to the signals input to the test signal input means in step (3), the test implement function operates and outputs "0" at the port 7, "1" at the port 8, "0" at the port 9, and "1", at the port 10 of the test signal output means.

(5) The signals output from the ports 7, 8, 9, and 10 of the test signal output means are stored in the boundary scan registers placed at the input pins 61, 62, 63, and 64 of the IC 60 that are set in Capture-DR state by the test equipment. Next, by setting the ICs 51 and 60 into Shift-DR state, these signals are sent to the test equipment via the boundary scan chain. The test equipment compares the signals received from the test signal output means with prestored output expected values, and if they match, proceeds to the next step; if they do not match, it is determined that there is a wiring fault.

(6) From the test equipment, the ICs 51 and 60 are again set into Shift-DR state, and signals "0", "1", "0", and "1" are set at the respective output pins 52, 53, 54, and 55 of the IC 51 via the boundary scan chain.

(7) From the test equipment, the ICs 51 and 60 are set into Update-DR state, and the signals "0", "1", "0", and "1" set at the respective output pins 52, 53, 54, and 55 of the IC 51 are output to the ports 3, 4, 5, and 6 of the test signal input means.

(8) In response to the signals input to the test signal input means in step (7), the test implement function operates and outputs "1" at the port 7, "0" at the port 8, "1" at the port 9, and "0" at the port 10 of the test signal output means.

(9) The signals output from the ports 7, 8, 9, and 10 of the test signal output means are stored in the boundary scan registers placed at the input pins 61, 62, 63, and 64 of the IC 60 that are set in Capture-DR state by the test equipment. Next, by setting the ICs 51 and 60 into Shift-DR state, these signals are sent to the test equipment via the boundary scan chain. The test equipment compares the signals sent from the test signal output means with prestored output expected values, and if they match, it is determined that the test results are correct, and the test process is terminated; if they do not match, it is determined that there is a wiring fault.

The test implement function shown in this example can be considered a buffer intervening between the output pin 52 of the IC 51 and the input pin 64 of the IC 60, between the output pin 53 of the IC 51 and the input pin 63 of the IC 60, between the output pin 54 of the IC 51 and the input pin 62 of the IC 60, and between the output pin 55 of the IC 51 and the input pin 61 of the IC 60, and logically, the test implement function can thus be ignored. That is, the output pin 52 of the IC 51 and the input pin 64 of the IC 60, the output pin 53 of the IC 51 and the input pin 63 of the IC 60, the output pin 54 of the IC 51 and the input pin 62 of the IC 60, and the output pin 55 of the IC 51 and the input pin 61 of the IC 60, shown in FIG. 4, may be considered as being logically interconnected. As a result, the usual boundary scan interconnect testing can be implemented without considering the presence of the microprocessor 1.

In this case, test logic such as previously shown can be automatically generated using boundary scan software without requiring a human engineer to write the logic.

As described, according to the above test method (second example), interconnect testing on the user configurable ports of the microprocessor 1 can be performed easily and completely by using boundary scan. Since the microprocessor 1 can be easily tested, the development time of the test program can be shortened. When combined with boundary scan, no test probes other than the test mode signal probe 30 are needed for testing, which means there is no need to add probes for test data signal input and output. This offers a great advantage in testing high packing density boards. The fact that the number of test probes can be minimized means a reduction in test tool cost. Furthermore, remote test diagnosis and product self-diagnostic functions can be easily implemented using the boundary scan technology.

Moreover, as previously described in connection with the first example, since there is no need to design boundary scan test circuitry into the microprocessor 1, silicon resources for integrated circuits can be saved.

Here, the storage means 100 with built-in assign function 106, activation control function 105, and test implement function 103 may be provided either internal or external to the microprocessor 1, and may be implemented by any type of storage means. A rewritable storage means may be used, in which case the above control method is used only during testing and the contents are erased after testing.

The assign function 106, the activation control function 105, and the test implement function 103 have been described as independent entities for the sake of explanation, but these functions need not necessarily be implemented as independent entities; rather, one function may be configured to also serve another function, or one function may be incorporated in the normal operation function of the microprocessor 1.

Furthermore, a test signal input/output means configured to serve the functions of both the test signal input means and the test signal output means may be assigned to ports of the microprocessor 1 by the assign function 106. This, however, may add some complexity to the test implement function.

It will be recognized that the test implement function 103 shown in the above embodiment is only illustrative, and the invention may be embodied in various other forms according to the actual circuit configuration.

We claim:

1. A test method for testing electrical connections between a circuit board and ports of a microprocessor mounted on said circuit board, said method involving the use of test equipment which transfers signals to and from said microprocessor, said microprocessor including a storage means storing an assign function for assigning one port of said microprocessor to mode identifying means for identifying a test mode and other ports of said microprocessor to test signal input means and test signal output means, respectively, in accordance with inputoutput directions of said other ports of said microprocessor; a test implement function for causing said test signal output means to output a test result signal corresponding to a test data signal supplied from said test signal input means; and an activation control function for detecting that said mode identifying means is in said test mode and then invoking said assign function and activating said test implement function, said method comprising:

(a) employing said test equipment to apply a test mode signal to said test mode identifying means;

(b) turning on power to said microprocessor;

(c) thereafter employing said microprocessor to perform initialization and then to invoke said assign function to assign said one port of said microprocessor to said test mode identifying means;

(d) employing said microprocessor to invoke said activation control function to (i) determine that said mode identifying means is in said test mode, (ii) thereafter to invoke said assign function to assign said other ports of said microprocessor to said test signal input means and said test signal output means in accordance with said input/output directions of said other ports of said microprocessor, and (iii) to activate said test implement function;

(e) employing said test equipment to apply said test data signal to said test signal input means;

(f) employing said microprocessor to invoke said test implement function to cause said test signal output means to output said test result signal corresponding to said test data signal; and (g) employing said test equipment to capture said test result signal and judge test results in accordance with said test result signals, thereby accomplishing the testing of said connections.

2. A test method for testing electrical connections between a circuit board and ports of a microprocessor mounted on said circuit board, said method involving the use of test equipment which transfers signals to and from said microprocessor, said microprocessor including a storage means storing an assign function for assigning one port of said microprocessor to mode identifying means for identifying a test mode and other ports of said microprocessor to test signal input means and test signal output means, respectively, in accordance with input/output directions of said other ports of said microprocessor; a test implement function for causing said test signal output means to output a test result signal corresponding to a test data signal supplied from said test signal input means; and an activation control function for detecting that said mode identifying means is in said test mode and then invoking said assign function and activating said test implement function, and said method comprising:

(a) turning on power to said microprocessor;

(b) thereafter employing said microprocessor to perform initialization and then to invoke said assign function to assign said one port of said microprocessor to said test mode identifying means;

(c) employing said microprocessor to perform said activation control function in continuous fashion along with normal operation;

(d) employing said test equipment to apply a test mode signal to said test mode identifying means at the time of initiating said testing of electrical connections;

(e) employing said microprocessor to invoke said activation control function to (i) determine that said mode identifying means is in said test mode, (ii) thereafter to invoke said assign function to assign said other ports of said microprocessor to said test signal input means and said test signal output means in accordance with said input/output directions of said other ports of said microprocessor, and (iii) to activate said test implement function;

(f) employing said test equipment to apply said test data signal to said test signal input means;

(g) employing said microprocessor to invoke said test implement function to cause said test signal output means to output said test result signal corresponding to said test data signal; and (h) employing said test equipment to capture said test result signal and judge test results in accordance with said test result signal, thereby accomplishing the testing of said connections.

3. A test method for testing electrical connections between a circuit board and ports of a microprocessor mounted on said circuit board, said method involving the use of test equipment which transfers signals to and from said microprocessor, said microprocessor being connected to an IEEE standard 1149.1 compliant device, said microprocessor including a storage means storing an assign function for assigning one port of said microprocessor to mode identifying means for identifying a test mode and other ports of said microprocessor to test signal input means and test signal output means, respectively, in accordance with input/output directions of said other ports of said microprocessor; a test implement function for causing said test signal output means to output a test result signal corresponding to a test data signal supplied from said test signal input means; and an activation control function for detecting that said mode identifying means is in said test mode and then invoking said assign function and activating said test implement function, said method comprising:

(a) employing said test equipment to apply a test mode signal to said test mode identifying means;

(b) turning on power to said microprocessor;

(c) thereafter employing said microprocessor to perform initialization and then to invoke said assign function to assign said one port of said microprocessor to said test mode identifying means;

(d) employing said microprocessor to invoke said activation control function to (i) determine that said mode identifying means is in said test mode, (ii) thereafter to invoke said assign function to assign said other ports of said microprocessor to said test signal input means and said test signal output means in accordance with said input/output directions of said other ports of said microprocessor, and (iii) to activate said test implement function;

(e) employing said test equipment to send a test signal to said IEEE standard 1149.1 compliant device and thereby cause said IEEE standard 1149.1 compliant device to output said test data signal to said test signal input means of said microprocessor;

(f) employing said microprocessor to invoke said test implement function to cause said test signal output means to output said test result signal corresponding to said test data signal;

(g) employing said IEEE standard 1149.1 compliant device to capture said test result signal via an input pin and send the same to said test equipment; and (h) employing said test equipment to judge test results in accordance with said test result signals, thereby accomplishing the testing of said connections.

4. A test method for testing electrical connections between a circuit board and ports of a microprocessor mounted on said circuit board, said method involving the use of test equipment which transfers signals to and from said microprocessor, said microprocessor being connected to an IEEE standard 1149.1 compliant device, said microprocessor including a storage means storing an assign function for assigning one port of said microprocessor to mode identifying means for identifying a test mode and other ports of said microprocessor to test signal input means and test signal output means, respectively, in accordance with input/output directions of said other ports of said microprocessor; a test implement function for causing said test signal output means to output a test result signal corresponding to a test data signal supplied from said test signal input means; and an activation control function for detecting that said mode identifying means is in said test mode and then invoking said assign function and activating said test implement function, and said method comprising:

(a) turning on power to said microprocessor;

(b) thereafter employing said microprocessor to perform initialization and then to invoke said assign function to assign said one port of said microprocessor to said test mode identifying means;

(c) employing said microprocessor to perform said activation control function in continuous fashion along with normal operation;

(d) employing said test equipment to apply a test mode signal to said test mode identifying means at the time of initiating said testing of electrical connections;

(e) employing said microprocessor to invoke said activation control function to (i) determine that said mode identifying means is in said test mode, (ii) thereafter to invoke said assign function to assign said other ports of said microprocessor to said test signal input means and said test signal output means in accordance with said input/output directions of said other ports of said microprocessor, and(iii) to activate said test implement function;

(f) employing said test equipment to send a test signal to said IEEE standard 1149.1 compliant device and thereby cause said IEEE standard 1149.1 compliant device to output said test data signal to said test signal input means of said microprocessor;

(g) employing said microprocessor to invoke said test implement function to cause said test signal output means to output said test result signal corresponding to said test data signal;

(h) employing said IEEE standard 1149.1 compliant device to capture said test result signal via an input pin and send the same to said test equipment; and (i) employing said test equipment to judge test results in accordance with said test results signals, thereby accomplishing the testing of said connections.

5. A test method according to claim 1, wherein said test signal input means comprises a plurality of input ports, said test signal output means comprises a plurality of output ports, and said test implement function operates so that a test signal input via any one of said input ports is output from a corresponding one of said test output ports without changing its logic.

6. A test method according to claim 2, wherein said test signal input means comprises a plurality of input ports, said test signal output means comprises a plurality of output ports, and said test implement function operates so that a test signal input via any one of said input ports from a corresponding one of said output ports without changing its logic.

7. A test method according to claim 3, wherein said test signal input means comprises a plurality of input ports, said test signal output means comprises a plurality of output ports, and said test implement function operates so that a test signal input via any one of said input ports is output from corresponding one of said output ports without changing its logic.

8. A test method according to claim 4, wherein said test signal input means comprises a plurality of input ports, said test signal output means comprises a plurality of output ports, and said test implement function operates so that a test signal input via any one of said input ports is output from a corresponding one of said output ports without changing its logic.

9. A microprocessor including in a storage means thereof:

an assign function for assigning one port of said microprocessor to a mode identifying means for identifying a test mode and other ports of said microprocessor to a test signal input means and a test signal output means, respectively, in accordance with input/output directions of said other ports of said microprocessor;

a test implement function for causing said test signal output means to output a test result signal corresponding to a test data signal supplied from said test signal input means; and an activation control function for detecting that said mode identifying means is in said test mode and then invoking said assign function and activating said test implement function.

10. A microprocessor according to claim 9, wherein said assign function, said activation control function, and said test implement function are permanently contained in said storage means.

11. A microprocessor according to claim 9, wherein said assign function is included in software provided to execute normal operation.

12. A microprocessor according to claim 9, wherein said assign function is included in said activation control function.

13. A microprocessor according to claim 9, wherein said assign function and said activation control function are included in said test implement function.

14. A microprocessor according to claim 9, wherein said assign function assigns test signal input/output means serving as both said test signal input means and said test signal output means to ports of said microprocessor.

15. A microprocessor according to claim 9, wherein said assign function assigns said mode identifying means to a plurality of ports of said microprocessor, said test implement function includes a plurality of test functions, and said activation control function activates an appropriate one of said plurality of test implement function in accordance with said identified test mode.

* * * * *